US009478576B1

(12) United States Patent
Yin et al.

(10) Patent No.: US 9,478,576 B1
(45) Date of Patent: Oct. 25, 2016

(54) SEALED-SIDEWALL DEVICE DIE, AND MANUFACTURING METHOD THEREOF

(71) Applicant: OmniVision Technologies, Inc., San Jose, CA (US)

(72) Inventors: Qian Yin, Milpitas, CA (US); Ming Zhang, Fremont, CA (US); Dyson Hsinchih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/698,355

(22) Filed: Apr. 28, 2015

(51) Int. Cl.
*H01L 21/56* (2006.01)
*H01L 27/146* (2006.01)

(52) U.S. Cl.
CPC ... *H01L 27/14632* (2013.01); *H01L 27/14618* (2013.01); *H01L 27/14621* (2013.01); *H01L 27/14627* (2013.01); *H01L 27/14685* (2013.01); *H01L 27/14687* (2013.01); *H01L 27/14698* (2013.01)

(58) Field of Classification Search
CPC ... H01L 21/56; H01L 31/0203; H01L 33/56; H01L 31/0232
See application file for complete search history.

(56) References Cited

U.S. PATENT DOCUMENTS

| 5,899,729 | A | 5/1999 | Lee | |
|---|---|---|---|---|
| 2005/0013554 | A1* | 1/2005 | Killer | G02B 6/4292 385/88 |
| 2005/0155954 | A1 | 7/2005 | Oba et al. | |
| 2011/0027921 | A1* | 2/2011 | Hamasaki | H01L 33/0095 438/26 |
| 2014/0322857 | A1 | 10/2014 | Lu et al. | |

OTHER PUBLICATIONS

Cheung, Annette Teng, Ph.D., "Dicing Advanced Materials for Microelectronics", IEEE, 2005 International Symposium on Advanced Packaging Materials Process, Properties and Interfaces, 4 pp.
Cook, Mike, "Scribe and Dice", The Advanced Semiconductor Magazine, vol. 19, No. 4, May 2006, pp. 20-24.
"Laser Application", Disco Corporation, accessed at https://web.archive.org/web/20140811095043/http://www.discousa.com/eg/products/catalog/pdf/laser.pdf, Aug. 11, 2014, 10 pp.
Lee, Seong-Min, "Processing Strategies for Protecting Integrated Circuit Pattern from Damage Due to a Dicing Saw Blade", Japanese Journal of Applied Physics, vol. 43, No. 8B, 2004, pp. L1068-L1071.
Mathur, et al., "What Camera Manufacturers Want", 2007 International Image Sensor Workshop, Ogunguit, Maine pp. 145-150.
Sullivan, et al., "Non-Traditional Dicing of MEMS Devices", NSTI-Nanotech 2008, www.nsti.org, ISBN 978-1-4200-8505-1 vol. 3, pp. 493-496.

* cited by examiner

*Primary Examiner* — Thomas L Dickey
(74) *Attorney, Agent, or Firm* — Lathrop & Gage LLP

(57) ABSTRACT

A method for fabricating a sealed-sidewall device die may include filling grooves of a deeply-grooved device wafer with a sealant, yielding a sealed grooved device wafer. The method may also include forming grooves in a device wafer to yield the deeply-grooved device wafer. The step of forming grooves may include forming a groove that at least partially penetrates each layer of the device wafer. The method may further include masking each device of the deeply-grooved device wafer. A sealed-sidewall device die may include at least one layer including a device substrate layer, a sidewall including a respective surface of each layer of the at least one layer, a sidewall sealant covering the sidewall, and a device formed on the device substrate layer. The sidewall sealant optionally does not cover a top surface of the device. The top surface of the device may directly adjoin an ambient medium thereabove.

15 Claims, 5 Drawing Sheets

SEALED-SIDEWALL DEVICE DIE, AND MANUFACTURING METHOD THEREOF

BACKGROUND

High-volume fabrication of complementary metal-oxide-semiconductor (CMOS) image sensors via wafer-level processes has contributed to the incorporation of cameras in high-volume consumer products such as mobile devices and motor vehicles. Such cameras each include a CMOS image sensor having a pixel array, wherein the top surface of each pixel is typically either a microlens or a spectral filter for focusing light or filtering light incident thereon. In a wafer level process, thousands of CMOS image sensors are formed on a device wafer, which may be optionally bonded to a carrier wafer, and then singulated into individual dies with a dicing saw. The dicing saw may separate-individual dies along previously-formed grooves. Such wafer dicing is known in the art, and explained by E. Iannone in *Labs on Chip: Principles, Design and Technology* (CRC Press, 2014). Both the groove formation and the die-sawing process can generate debris that adheres to one or more pixel top surfaces. These contaminants render the associated pixel inoperable and are a significant contributor to reduced product manufacturing yield.

SUMMARY OF THE INVENTION

The systems and methods disclosed herein prevent image sensor contamination from debris produced when die-cutting at least one of the device wafer and the carrier wafer.

A method for fabricating a sealed-sidewall device die is disclosed. The method may include filling grooves of a deeply-grooved device wafer with a sealant, yielding a sealed grooved device wafer. The method may also include forming grooves in a device wafer to yield the deeply-grooved device wafer. The step of forming grooves may include forming a groove that at least partially penetrates each layer of the device wafer. The method may further include masking each device of the deeply-grooved device wafer.

A sealed-sidewall device die is disclosed. The sealed-sidewall device die may include at least one layer including a device substrate layer, a sidewall including a respective surface of each layer of the at least one layer, a sidewall sealant covering the sidewall, and a device formed on the device substrate layer. The sidewall sealant optionally does not cover a top surface of the device. The top surface of the device may directly adjoin an ambient medium thereabove. The sidewall sealant may be formed of at least one of (a) a solder mask material and (b) a polyimide material.

DETAILED DESCRIPTION

Figure 1:
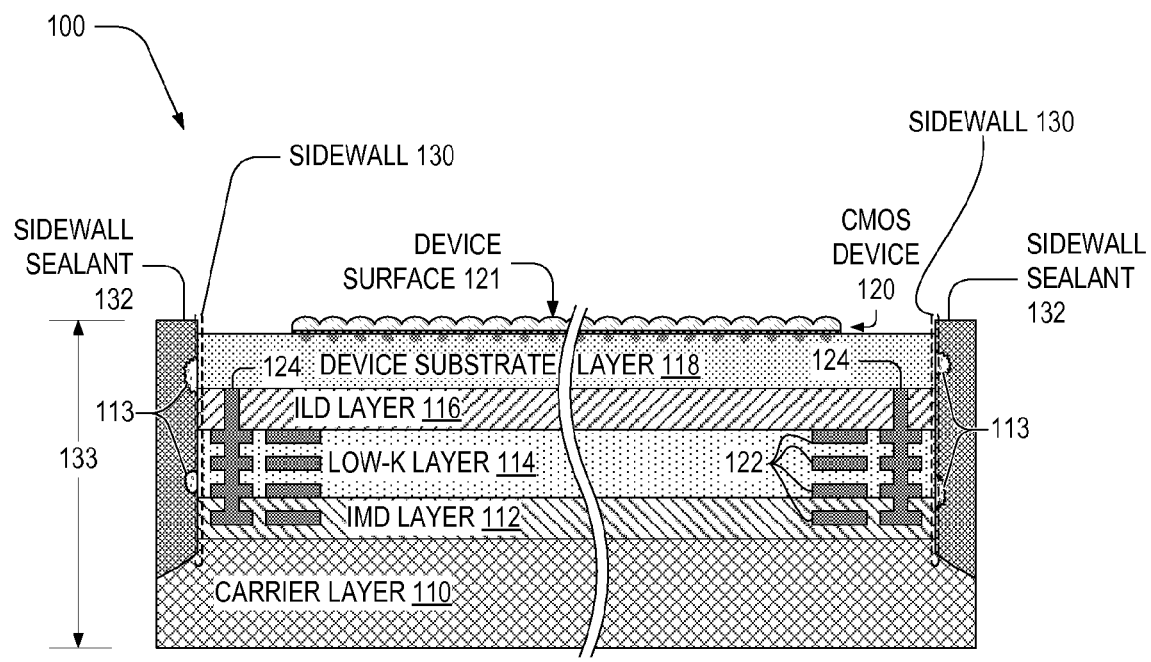
FIG. 1 is a cross-sectional view of an exemplary sealed-sidewall device die, in an embodiment.

FIG. 1 a cross-sectional view of an exemplary sealed-sidewall device die 100. Sealed-sidewall device die 100 may include a CMOS device 120 formed within one or more of an inter-metal dielectric (IMD) layer 112, a low-k dielectric layer 114, an inter-layer dielectric (ILD) layer 116, and a device substrate layer 118. IMD layer 112 and ILD layer 116 may both be oxides. Device substrate layer 118 is formed of silicon, for example. Sealed-sidewall device die 100 may also include metal layers 122 and vertical interconnects 124. Sealed-sidewall device die 100 may include additional layers between carrier layer 110 and device substrate layer 118 without departing from the scope hereof. Additionally and alternatively, sealed-sidewall device die 100 may lack at least one of layers 112, 114, and 116. Sealed-sidewall device die 100 may also include a carrier layer 110.

For clarity of illustration, FIG. 1 illustrates only a portion of CMOS device 120 above or near a top surface of device substrate layer 118. CMOS device 120 may electrically connect to vertical interconnects 124.

FIG. 1 depicts CMOS device 120 as an image sensor. CMOS device 120 may be a different type of device manufacturable with CMOS processes, such as one including micro-electro-mechanical systems (MEMS), without departing from the scope hereof. In an embodiment, sealed-sidewall device die 100 has a thickness 133 less than 400 microns.

CMOS device 120 has a top device surface 121 that may be directly exposed to an ambient medium 190, such that surface 121 is not covered by sidewall sealant 132 and directly adjoins ambient medium 190. Ambient medium 190 is for example air, vacuum, or a dielectric. Alternatively, a protective film may be between top device surface 121 and ambient medium 190, in which neither the protective film nor sidewall sealant 132 interferes with the operation of CMOS device 120 by, for example, blocking light incident thereon. Top surface 121 may correspond to at least one of a surface of a microlens array of a CMOS image sensor, a surface of a color filter array of a CMOS image sensor, and a semiconductor depletion region.

Sealed-sidewall device die 100 has sidewalls 130 sealed by sidewall sealants 132. Sidewalls 130 include surfaces of layers 110, 112, 114, 116, 118. For clarity of illustration, sidewalls 130 are enclosed by a dotted box in FIG. 1. Sidewall sealants 132 may cover surfaces of at least one layer 112, 114, 116, 118, while not covering a surface of carrier layer 110, without departing from the scope hereof.

Sidewall sealants 132 may trap debris 113 that adheres to sidewalls 130. Debris 113 may be formed of constituent materials of sealed-sidewall device die 100, which includes carrier layer 110, IMD layer 112, low-k dielectric layer 114, ILD layer 116, and device substrate layer 118. Debris 113 forms during one or both of a grooving step and dicing step of the wafer-level fabrication of sealed-sidewall device die 100. Sidewall sealants 132 may also prevent moisture from reaching CMOS device 120 and layers 112, 114, 116, and 118.

Materials that constitute sidewall sealants 132 may include polymers, polyimides, and solder mask materials. A solder mask material may satisfy the description provided in U.S. Pat. No. 4,120,843 to Ameed at al. That is, the material may include a thermoplastic, a thermostable strippable base of polysulfone, a solvent for the polysulfone, and a filler of finely divided silicon dioxide particles. The solvent may include at least one of orthodichlorobenzene, monochlorobenzene, methylene chloride and trichloroethylene. The filler functions to hold the molten polysulfone in place during the solder dipping operation.

Figure 2:
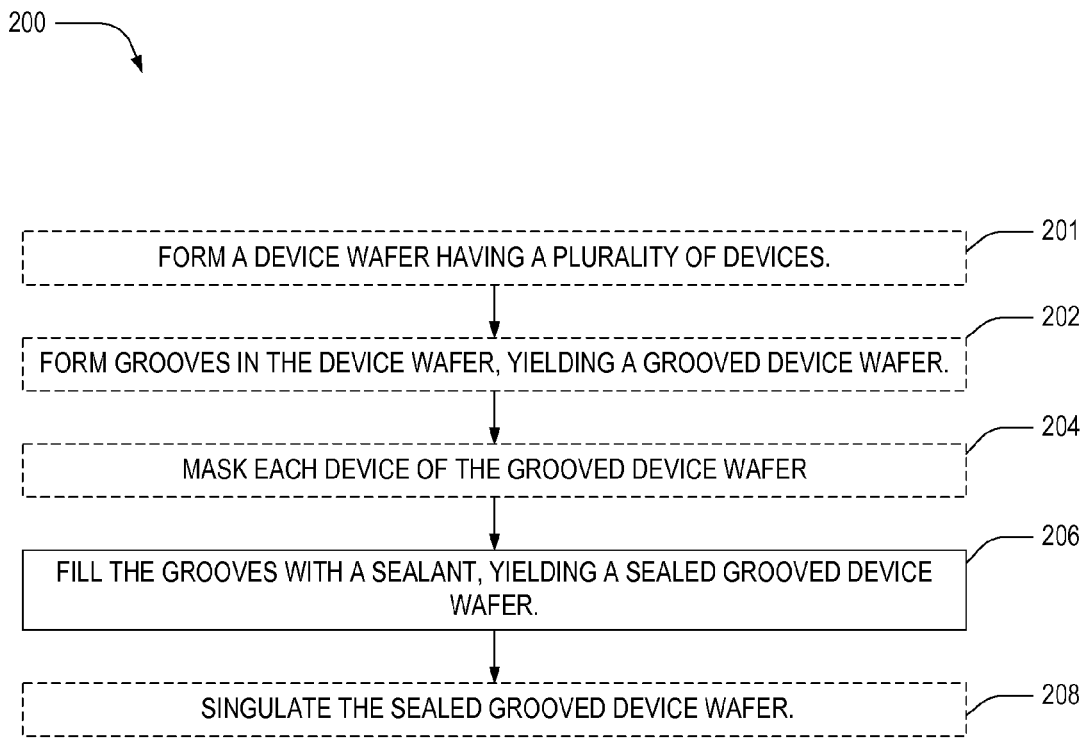
FIG. 2 is a flowchart illustrating an exemplary method for fabricating the sealed-sidewall device die of FIG. 1, in an embodiment.
Figure 3:
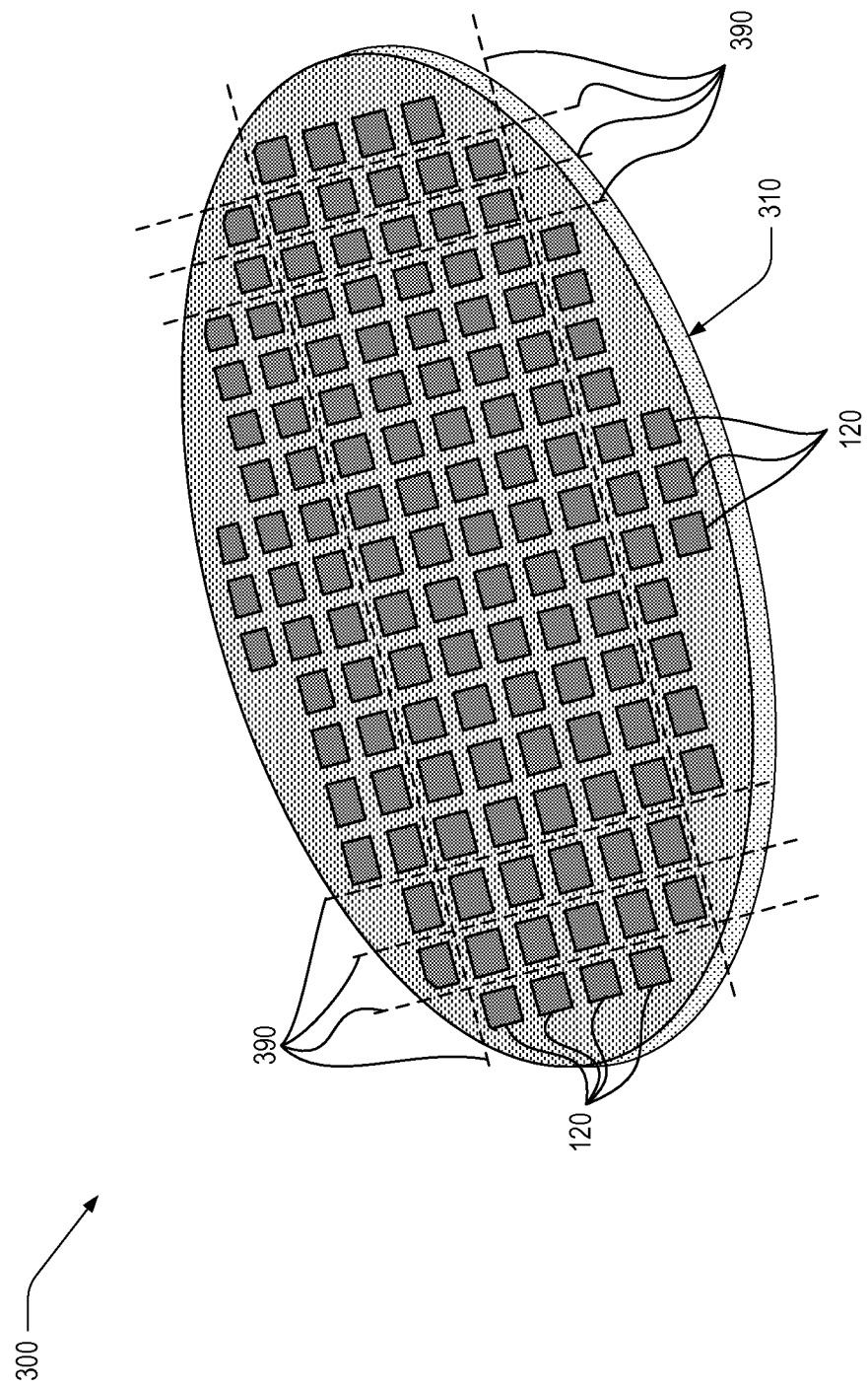
FIG. 3 is a perspective view of a device wafer, having a plurality of CMOS devices, that may be singulated into sealed-sidewall device dies, in an embodiment.
Figure 4:
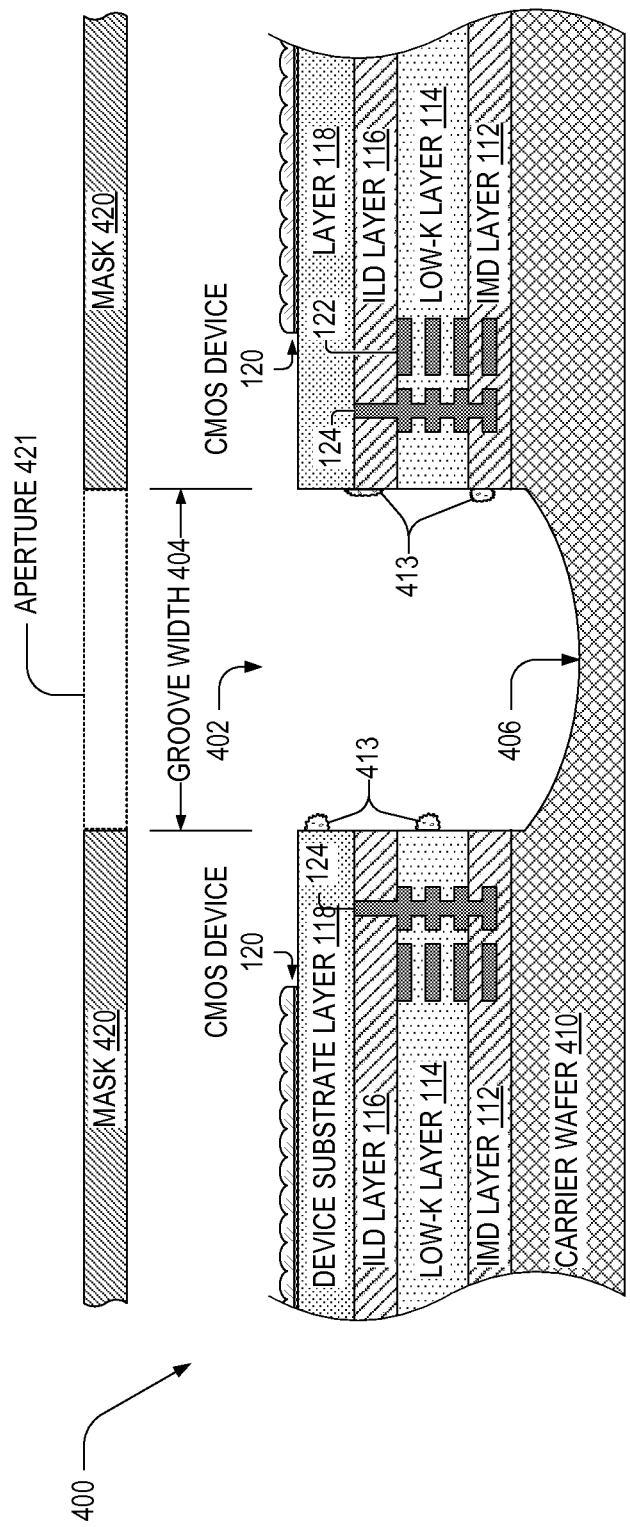
FIG. 4 is a cross-sectional view of a grooved device wafer, in an embodiment.
Figure 5:
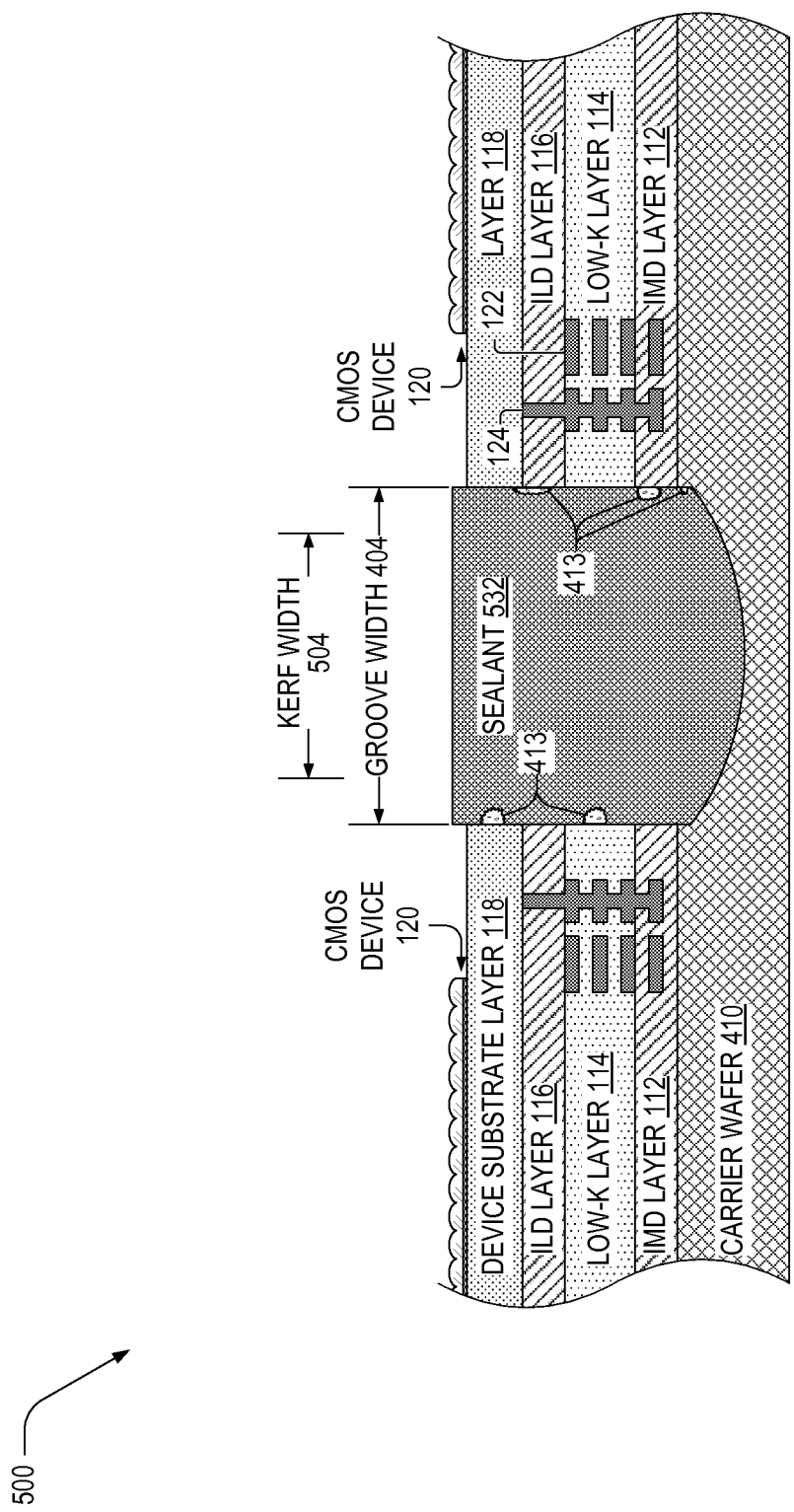
FIG. 5 is a cross-sectional view of the grooved device wafer with its groove filled with sealant according to the method of FIG. 2, in an embodiment.

FIG. 2 is a flowchart illustrating an exemplary method 200 for fabricating a sealed-sidewall device die 100. FIG. 3 is a perspective view of a device wafer 300, having a plurality of CMOS devices 120 formed in one or more layers 112, 114, 116, and 118 of device wafer 300. Device wafer 300 may be singulated along dicing lines 390 into sealed-sidewall device dies 100 using method 200. Device wafer 300 may also have a carrier wafer 310, of which carrier layer 110 is a portion, bonded thereto on a side opposite CMOS devices 120. For clarity of illustration, not all CMOS devices 120 are labeled in FIG. 3. FIGS. 4 and 5 show cross-sectional views of CMOS devices 120 on a carrier wafer, the views corresponding to steps of method 200. FIGS. 2-5 are best viewed together with the following description.

Step 201 is optional. If included, in step 201, method 200 forms a device wafer having a plurality of devices. In an example of step 201, method 200 forms a device wafer 300. Each CMOS device 120 on device wafer 300 may be a CMOS image sensor that may include a color filter array with a microlens array thereon.

Step 202 is optional. If included, in step 202, method 200 forms grooves in the device wafer, yielding a grooved device wafer. In an example of method 200, device wafer 300 is laser grooved along dicing lines 390, which results in a grooved device wafer 400. Alternatively, grooved device wafer may be formed by die-sawing instead of laser grooving, or by a combination of die-sawing and laser grooving. FIG. 4 is a cross-sectional view of grooved device wafer 400. Groove 402 is between pairs of IMD layers 112, low-k dielectric layers 114, ILD layers 116, and device substrate layer 118, surfaces of which are part of sidewalls 130, as in FIG. 1. Step 202 produces debris 413, which is similar to debris 113.

Grooves 402 are shown FIG. 4 to have a spatially-varying depth with a single local maximum depth centered within the groove, as denoted by groove bottom 406 on a surface of carrier wafer 410. Carrier wafer 410 is carrier wafer 310 with portions removed by step 202. Without departing from the scope hereof, grooves 402 may have a spatially-varying depth with more than one local maxima, for example, resulting from multiple laser grooves as described in U.S. patent application Ser. No. 11/036,334 assigned to Disco Corporation.

In the above example, step 202 forms groove 402 with groove bottom 406, which is part of a surface of carrier wafer 410. That is, step 202 may form a deep groove, which herein refers to a groove that partially or completely penetrates each layer of device wafer 300. (Carrier wafer 310 is a layer of device wafer 300.) Alternatively, step 202 may form a groove that partially or completely penetrates at least one layer, but not all layers, of device wafer 300, without departing from the scope hereof. For example, step 202 may form a groove that does not extend into carrier wafer 310, and hence has a groove bottom that is part of a surface of one or more layers 112, 114, 116, and 118.

Step 204 is optional. If included, in step 204, method 200 masks each device of the grooved device wafer. In an example of step 204, an apertured mask 420 is aligned to and placed above grooved device wafer 400 such that each CMOS device 120 of grooved device wafer 400 is completely beneath a non-apertured region of apertured mask 420, as shown in FIG. 4. Grooved device wafer 400 is an example of a deeply-grooved device wafer, as groove 402 at least partially penetrates each layer of device wafer 400. Apertured mask 420 has an aperture 421 (shown as a dotted box in FIG. 4) positioned above groove 402. Apertured mask 420 is for example a stencil used in stencil printing of solder paste.

In step 206, method 200 fills grooves of the grooved device wafer with a sealant, yielding a sealed grooved device wafer. In an example of step 206, grooves 402 are filled with a sealant 532 as shown in FIG. 5. Step 206 results in a sealed grooved device wafer 500, which is grooved device wafer 400 with grooves filled with a sealant 532.

In step 206, sealant 532 may be stencil-printed or screen-printed onto device wafer 300, in which apertured mask 420 is a stencil or screen that permits sealant 532 to fill grooves 402 while preventing sealant 532 from covering CMOS devices 120. Covering CMOS devices 120 with sealant 532 may render them inoperable, for example, if CMOS devices 120 are image sensors or devices that include MEMS. Step 206 may fill grooves of the grooved device wafer via other methods, such as those used to pattern solder mask on a printed circuit board, without departing from the scope hereof.

Step 208 is optional. If included, in step 208, method 200 singulates the sealed grooved device wafer. In an example of step 208, sealed grooved device wafer 500 is blade-diced with a saw having a kerf width 504 that is narrower than groove width 404 of grooves 402. For example, groove width 404 and kerf width 504 may equal 70 microns and 50 microns respectively. In embodiments of method 200 in which step 202 includes laser grooving the device wafer, steps 204 and 208 may resemble the semiconductor wafer processing method of aforementioned U.S. patent application Ser. No. 11/036,334. In a different example of step 208, sealed grooved device wafer 500 may be singulated by means other than blade-dicing, such as laser-dicing and stealth dicing.

Step 208 yields a plurality of sealed-sidewall device dies 100. As sidewall sealants 132 of FIG. 1 are portions of sealant 532 not removed in the singulation step 208, sealant 532 may be formed of the same materials as sidewall sealants 132.

Combinations of Features

Features described above as well as those claimed below may be combined in various ways without departing from the scope hereof. The following examples illustrate some possible, non-limiting combinations:

(A1) A method for fabricating a sealed-sidewall device die may include filling grooves of a deeply-grooved device wafer with a sealant, yielding a sealed grooved device wafer.

(A2) The method denoted as (A1) may also include forming grooves in a device wafer to yield the deeply-grooved device wafer.

(A3) In the method denoted as (A2), the step of forming grooves may include forming a groove that at least partially penetrates each layer of the device wafer.

(A4) Any of the methods denoted as (A1) through (A3), may further include, before the step of filling, masking each device of the deeply-grooved device wafer.

(A5) In any of the methods denoted as (A4), the step of masking may include aligning an apertured mask above the deeply-grooved device wafer such that each device of the deeply-grooved device wafer is completely beneath a non-apertured region of the apertured mask.

(A6) In any of the methods denoted as (A5), the step of filling may include stencil printing the sealant with a stencil aligned above the deeply-grooved device wafer such that each device of the grooved device wafer is completely beneath a non-apertured region of the stencil.

(A7) Any of the methods denoted as (A1) through (A6) may further include singulating the sealed grooved device wafer along the grooves filled with sealant.

(A8) Any of the methods denoted as (A1) through (A7) may further include, before the step of filling, forming a device wafer having a plurality of devices.

(B1) A sealed-sidewall device die may include at least one layer including a device substrate layer, a sidewall including a respective surface of each layer of the at least one layer, a sidewall sealant covering the sidewall, and a device formed on the device substrate layer.

(B2) In the device denoted as (B1), the sidewall sealant may be formed of at least one of (a) a solder mask material and (b) a polyimide material.

(B3) Either or both devices denoted as (B1) and (B2) may further include a carrier layer.

(B4) In any of the devices denoted as (B1) through (B3), the sidewall sealant may not cover a top surface of the device.

(B5) In any of the devices denoted as (B1) through (B4), a top surface of the device may directly adjoin an ambient medium thereabove.

(B6) In any of the devices denoted as (B1) through (B5), the device may be an image sensor.

(B7) In any of the devices denoted as (B6), the sidewall sealant optionally does not cover a top surface of the image sensor.

(B8) In either or both devices denoted as (B6) and (B7), the top surface may include a surface of at least one of a microlens array, a color filter array, and a semiconductor depletion region.

(B9) In any of the devices denoted as (B6) though (B8), the top surface of the image sensor may directly adjoin an ambient medium above the image sensor.

Changes may be made in the above methods and systems without departing from the scope hereof. It should be made in thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for fabricating a sealed-sidewall device die comprising filling grooves of a deeply-grooved device wafer with a sealant, each groove at least partially penetrating each layer of the device wafer, yielding a sealed grooved device wafer.

2. The method claim 1, further comprising forming grooves in a device wafer, each groove at least partially penetrating each layer of the device wafer, to yield the deeply-grooved device wafer.

3. The method claim 1, further comprising before the step of filling, masking each device of the deeply-grooved device wafer.

4. The method claim 3, the step of masking comprising aligning an apertured mask above the deeply-grooved device wafer such that each device of the deeply-grooved device wafer is completely beneath a non-apertured region of the apertured mask.

5. The method claim 1, the step of filling comprising stencil printing the sealant with a stencil aligned above the deeply-grooved device wafer such that each device of the deeply-grooved device wafer is completely beneath a non-apertured region of the stencil.

6. The method claim 1, further comprising singulating the sealed grooved device wafer along the grooves filled with sealant.

7. The method claim 1, further comprising before the step of filling, forming a device wafer having a plurality of devices.

8. A sealed-sidewall device die comprising:
at least one layer including a device substrate layer;
a sidewall including a respective surface of each layer of the at least one layer;
a sidewall sealant covering the sidewall; and
a device formed on the device substrate layer; and
a carrier layer having a carrier-layer-sidewall adjoining the sidewall and at least partially covered by the sidewall sealant, the device substrate layer being located between the device and the carrier layer.

9. The device die of claim 8, the sidewall sealant being formed of at least one of (a) a solder mask material and (b) a polyimide material.

10. The device die of claim 8, the sidewall sealant not covering a top surface of the device.

11. The device die of claim 8, a top surface of the device directly adjoining an ambient medium thereabove.

12. The device die of claim 8, the device being an image sensor.

13. The device die of claim 12, the sidewall sealant not covering a top surface of the image sensor.

14. The device die of claim 13, the top surface including a surface of at least one of a microlens array, a color filter array, and a semiconductor depletion region.

15. The device die of claim 13, the top surface of the image sensor directly adjoining an ambient medium above the image sensor.

* * * * *

UNITED STATES PATENT AND TRADEMARK OFFICE
CERTIFICATE OF CORRECTION

PATENT NO. : 9,478,576 B1  Page 1 of 1
APPLICATION NO. : 14/698355
DATED : October 25, 2016
INVENTOR(S) : Qian Yin et al.

It is certified that error appears in the above-identified patent and that said Letters Patent is hereby corrected as shown below:

On the Title Page

1. Column 2, Item (57), "Ogunguit" should read -- Ogunquit --;

In the Claims

2. Column 5, Line 50, "The method claim" should read -- The method of claim --;
3. Column 6, Line 3, "The method claim" should read -- The method of claim --;
4. Column 6, Line 6, "The method claim" should read -- The method of claim --;
5. Column 6, Line 11, "The method claim" should read -- The method of claim --;
6. Column 6, Line 16, "The method claim" should read -- The method of claim --;
7. Column 6, Line 19, "The method claim" should read -- The method of claim --.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*